(12) United States Patent
Wirbeleit

(10) Patent No.: US 7,329,606 B1
(45) Date of Patent: Feb. 12, 2008

(54) SEMICONDUCTOR DEVICE HAVING NANOWIRE CONTACT STRUCTURES AND METHOD FOR ITS FABRICATION

(75) Inventor: Frank Wirbeleit, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 87 days.

(21) Appl. No.: 11/323,290

(22) Filed: Dec. 29, 2005

(51) Int. Cl.
*H01L 21/44* (2006.01)

(52) U.S. Cl. ............... 438/681; 438/692; 438/510; 438/931; 438/197; 257/E21.17; 257/E21.23; 257/E21.182; 257/E21.231; 257/E21.304

(58) Field of Classification Search ............ 438/681, 438/680, 692, 618, 197, 510, 311, 663, 733, 438/734, 931
See application file for complete search history.

(56) References Cited

U.S. PATENT DOCUMENTS

| 6,340,822 B1* | 1/2002 | Brown et al. ............... 257/25 |
| 6,383,923 B1* | 5/2002 | Brown et al. ............... 438/666 |
| 6,465,132 B1* | 10/2002 | Jin .......................... 429/231.8 |
| 6,664,727 B2* | 12/2003 | Nakamoto ................. 313/495 |
| 6,864,162 B2* | 3/2005 | Jin .......................... 438/551 |
| 6,870,361 B2* | 3/2005 | Chopra et al. ............ 324/158.1 |
| 7,208,094 B2* | 4/2007 | Islam et al. ................. 216/2 |
| 7,233,101 B2* | 6/2007 | Jin .......................... 313/309 |

OTHER PUBLICATIONS

Kang, B.C., Lee, S.B, Boo, J.H,; Growth of B-SIC nanowires of Si(100) Subtrates by MOCVD using nickel as a catalyst, Science Direct, Thin solid films 464, 465 (Jul. 23, 2004) 215-219.

* cited by examiner

*Primary Examiner*—David Nhu
(74) *Attorney, Agent, or Firm*—Ingrassia Fisher & Lorenz, P.C.

(57) ABSTRACT

A semiconductor device having small electrical contacts to impurity doped regions and a method for fabrication of such a device are provided. In accordance with one embodiment of the invention the semiconductor device comprises a semiconductor substrate having a doped region formed therein. The doped region has a nucleating layer comprising nickel on its surface, and a nanowire structure comprising silicon and carbon electrically contacts the nucleating layer.

14 Claims, 5 Drawing Sheets

SEMICONDUCTOR DEVICE HAVING NANOWIRE CONTACT STRUCTURES AND METHOD FOR ITS FABRICATION

TECHNICAL FIELD OF THE INVENTION

The present invention generally relates to semiconductor devices and to methods for their fabrication, and more particularly relates to semiconductor devices having small nanowire contact structures.

BACKGROUND OF THE INVENTION

Integrated circuits (ICs) are made up of large numbers of semiconductor devices that are interconnected by conductive, usually metallized lines. Such conductive lines will be referred to herein, without limitation, as metallized lines. Several layers of interconnecting metallized lines separated by interlayer dielectric (ILD) layers may be needed to complete all of the necessary circuit connections. Contacts must be formed through the ILD layers at selected locations to allow electrical connections either between metal layers or between a metal layer and a device region in the underlying semiconductor substrate.

In conventional integrated circuit devices the contacts through ILD layers are formed by etching a contact opening through the dielectric material using a photolithographic process. The contact opening is filled by one or more layers of deposited metallic materials. There are many know processes for filling the contact openings. For example, in some applications the contact opening may be filled with a tungsten plug that is formed by depositing sequential layers of titanium, titanium nitride, and tungsten. In other applications, the contact hole may be filled with a layer of tantalum followed by the electrodeposition of a layer of copper.

As ICs become more complex, more and more devices are included on a single semiconductor chip. To accommodate the increasing number of devices, the size of each device and hence the size of each element of a device becomes smaller and smaller. Device size on an IC chip is usually defined by the smallest line or the smallest space between lines that is allowed by the design rules for the chip. Minimum line widths are now in the range of 50 nanometers (nm) or less. As device sizes are reduced, the area allowed for a contact formed through the ILD layers is also reduced. It is becoming increasingly difficult to fabricate such electrical contacts and to insure that the contacts form a reliable connection between device regions.

Accordingly, it is desirable to provide a method for fabricating semiconductor devices having reliable electrical contacts extending through dielectric layers. In addition, it is desirable to provide a semiconductor device that includes a small but reliable contact extending through an ILD layer. Furthermore, other desirable features and characteristics of the present invention will become apparent from the subsequent detailed description and the appended claims, taken in conjunction with the accompanying drawings and the foregoing technical field and background.

BRIEF SUMMARY OF THE INVENTION

In accordance with one embodiment of the invention a semiconductor device having small electrical contacts to impurity doped regions is provided. The semiconductor device comprises a semiconductor substrate having a doped region formed therein. The doped region has a nucleating layer comprising nickel on its surface, and a nanowire structure comprising silicon and carbon electrically contacts the nucleating layer.

In accordance with another embodiment of the invention a method is provided for fabricating a semiconductor device having small electrical contacts to impurity doped regions. The method comprises the steps of forming an impurity doped region in the semiconductor substrate, and forming a nucleating layer overlying the impurity doped region. An electrically conductive nanowire structure is then selectively grown on the nucleating layer.

In accordance with a further embodiment of the invention a method is provided for fabricating a semiconductor device having a nanowire structure contact between two conductor layers. The method comprises the steps of forming a first conductive layer and forming a nucleating layer on the first conductive layer. An electrically conductive nanowire structure is selectively grown on the nucleating layer and a dielectric layer is deposited to at least partially surround the nanowire structure. The surface of the dielectric layer is planarized to expose a portion of the nanowire structure, and a patterned interconnect layer is formed overlying the dielectric layer and contacting the portion of the nanowire structure.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
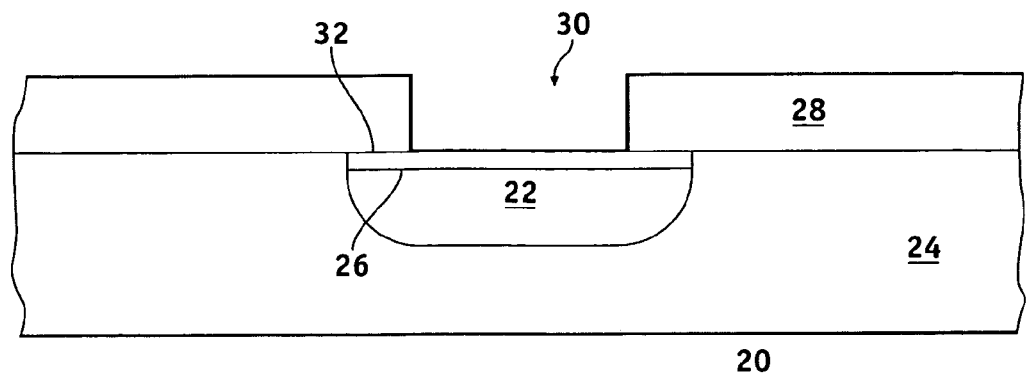
FIGS. 1-4 illustrate, in cross section, a portion of a semiconductor device and methods for its fabrication in accordance with various embodiments of the invention.

FIGS. 1-4 illustrate, in cross section, a portion of a semiconductor device 20 and methods for its fabrication in accordance with various embodiments of the invention. Semiconductor device 20 can be, for example, an integrated circuit. Such a semiconductor device would include a large number of electrically conductive regions such as impurity doped regions 22, only one of which is illustrated in the figures, formed in a semiconductor substrate 24 as illustrated in FIG. 1. Impurity doped region 22 could be, for example, a source or drain region of an MOS integrated circuit or a base, emitter, or collector contact region of a bipolar integrated circuit. The semiconductor substrate is preferably a silicon substrate wherein the term "silicon substrate" is used herein to encompass the relatively pure silicon materials typically used in the semiconductor industry as well as silicon admixed with other elements such as germanium and the like. Alternatively, the semiconductor substrate can be germanium, gallium arsenide, or other semiconductor material. For ease of discussion, semiconductor substrate 24 will herein be referred to as a silicon substrate, although those of skill in the art will appreciate that the substrate could also be any of the alternative semiconductor materials. Silicon substrate 24 can be a bulk silicon wafer as illustrated, or can be (although not illustrated) a thin layer of silicon on an insulating layer (commonly know as a silicon-on-insulator or SOI) that, in turn, is supported by a carrier wafer. Impurity doped region 22 can be impurity doped, for example, by ion implantation with arsenic or phosphorus ions for an N-type region or with boron ions for a P-type region. Various steps in the manufacture of semiconductor devices, such as forming impurity doped regions by ion implantation are well known and so, in the interest of brevity, many conventional steps will only be mentioned briefly herein or will be omitted entirely without providing the well known process details.

The impurity doped regions must be electrically contacted, either directly or indirectly by an electrically conductive material that interconnects the various elements of the integrated circuit to implement the desired circuit function. As noted above, the area on an integrated circuit that is allocated to forming a contact to an impurity doped region is constantly being decreased as the complexity of the integrated circuit increases. A small area, low resistance contact to impurity doped region 22 is formed, in accordance with an embodiment of the invention, by a plurality of selectively grown, highly conductive nanowires. Such a plurality of nanowires will hereinafter be referred to as a nanowire structure.

In accordance with one embodiment of the invention, a nucleating layer 26 is formed at the surface of impurity doped region 22. A masking layer 28 is formed over the nucleating layer and is patterned to expose a portion 30 of the nucleating layer and to leave unexposed a portion 32 of that layer.

Figure 2:
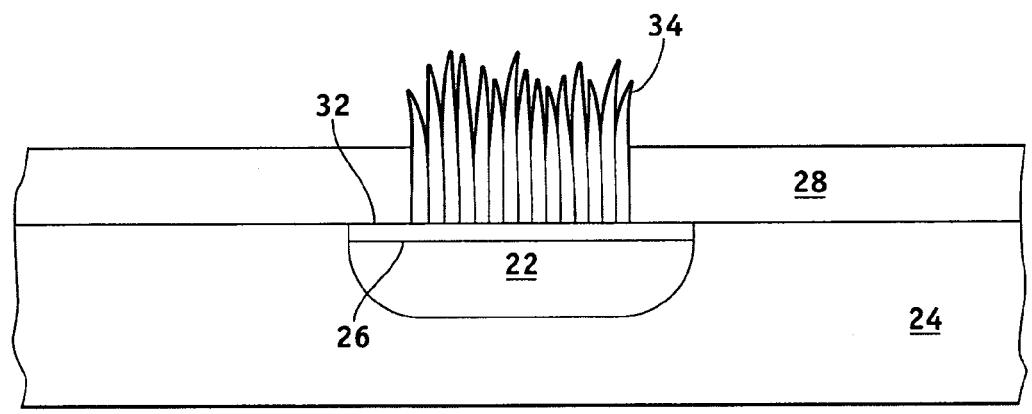

A nanowire structure 34 is selectively grown on the exposed portion of the nucleating layer, as illustrated in FIG. 2, by a selective growth process. Because the growth process is selective, the growth of the nanowire structure occurs only on the exposed portion of the nucleating layer. The nanowire structure comprises a plurality of individual, thin, elongated irregularly shaped, irregularly oriented nanowires that extend upwardly from the nucleating layer and that have an appearance similar to a clump of grass. The individual nanowires can be grown to a length of up to about 100 micrometers (μm) with a diameter of up to about 40-60 nm. For use as an electrical contact to an impurity doped region, it is only necessary to grow the nanowires to a length of a few hundred nanometers, or at most, to a few micrometers.

Figure 3:
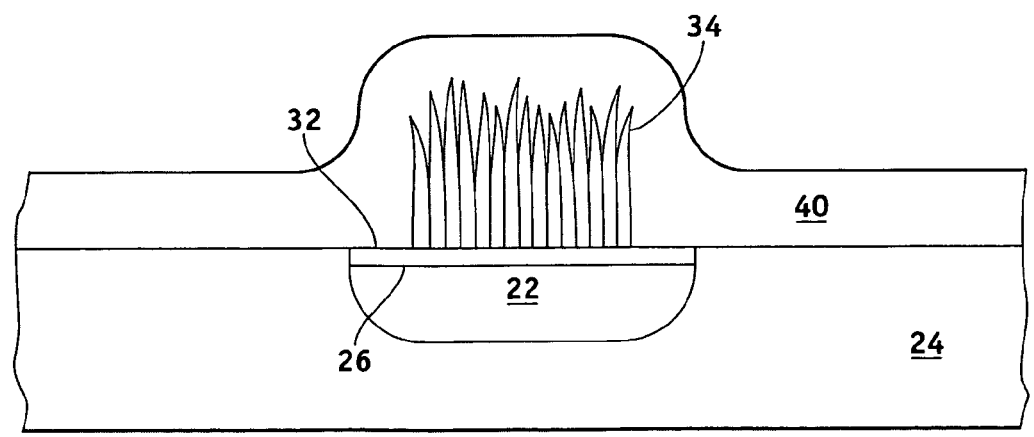

After growing the nanowire structure, the masking layer can be removed and the structure can be stabilized by depositing a layer 40 of dielectric material onto the surface of the silicon substrate and at least partially surrounding the nanowire structure as illustrated in FIG. 3. Because of the irregular shape and length of the nanowires, some wires may not be completely covered by the dielectric material. In addition to stabilizing the nanowire structure, the layer of dielectric material is also used as an interlayer dielectric (ILD) layer.

Figure 4:
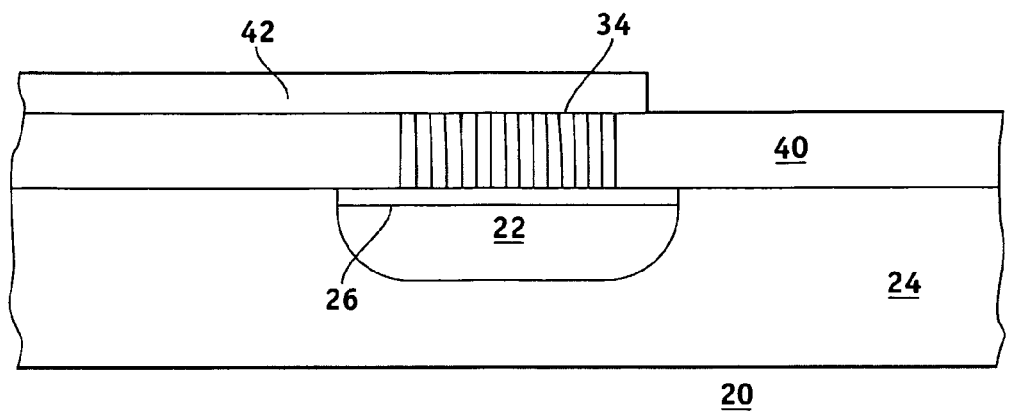

Layer 40 is planarized, for example by a chemical mechanical planarization (CMP) process, as illustrated in FIG. 4. The CMP process planarizes the surface of layer 40 and planarizes and exposes the top of nanowire structure 34. The exposed portion of nanowire structure 34 is then contacted by a patterned interconnect layer 42.

The following are non-limiting examples illustrating the practice of various embodiments of the invention.

EXAMPLE 1

Figure 5:
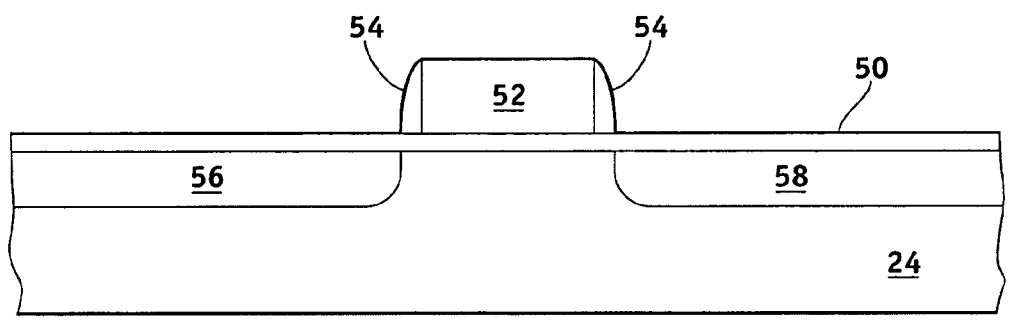
FIGS. 5-8 illustrate, in cross section, a portion of a semiconductor device and methods for its fabrication in accordance with further embodiments of the invention.

A thin silicon dioxide gate insulator layer 50 is thermally grown on the surface of a silicon substrate 24 that has been doped with P-type conductivity determining impurities. A layer of polycrystalline silicon is deposited onto the gate insulator layer by a chemical vapor deposition (CVD) process and is photolithographically patterned and etched to form a polycrystalline silicon gate electrode 52. Sidewall spacers 54 are formed on the sidewalls of gate electrode 52 by depositing a layer of insulating material and subsequently etching the layer of insulating material by reactive ion etching (RIE). The layer of insulating material can be, for example, a silicon oxide or silicon nitride deposited by a low pressure chemical vapor deposition (LPCVD) process. Source region 56 and drain region 58 are formed in self alignment with gate electrode 52 by ion implanting arsenic ions into substrate 24 using the sidewall spacers as ion implantation masks. This device structure 59, which is a conventional N-channel MOS transistor structure, is illustrated in FIG. 5.

A nucleating layer 60 is formed at the surface of source region 56 and drain region 58. In accordance with one embodiment of the invention nucleating layer 60 comprises a localized nickel rich area at the silicon substrate surface. A nickel rich area can be formed, for example, by ion implanting nickel ions into the surface of source region 56 and drain region 58, again using the sidewall spacers as ion implantation masks. Following the implantation, the gate oxide that is not covered by the gate electrode or the sidewall spacers is removed.

Alternatively, a nickel rich area can be formed by removing any oxide from the surface of the source and drain regions and blanket depositing a thin layer of nickel by a physical vapor deposition process. The thin layer of nickel is heated, for example to a temperature of about 400° C. by rapid thermal annealing, to react the nickel with silicon to form a nickel silicide wherever the nickel is in direct contact with silicon. The nickel remains unreacted wherever nickel is not in contact with silicon such as along the sidewall spacers. The unreacted nickel can be removed by wet etching in a $HNO_3/HCl$ solution.

Figure 6:
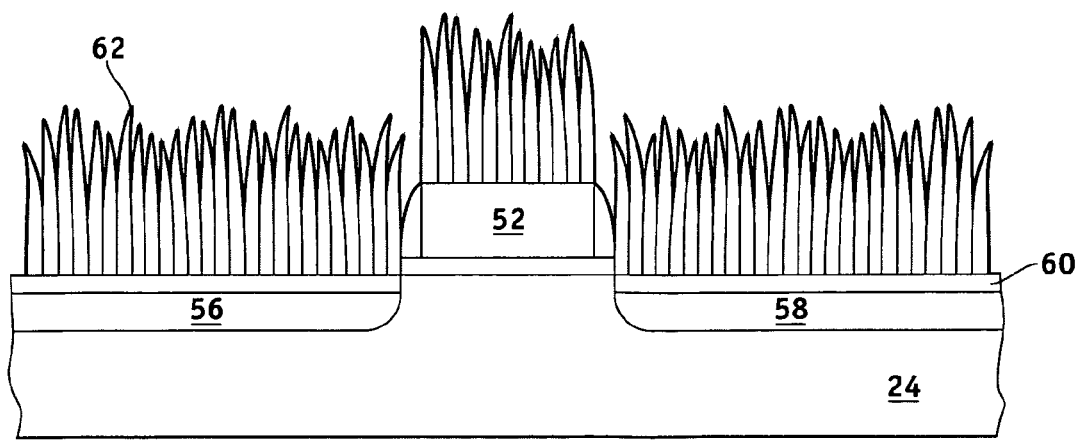

Nanowires 62 comprising silicon and carbon and preferably β-SiC are selectively grown on the nickel rich areas by a selective growth process as illustrated in FIG. 6. The selective growth of β-SiC nanowires is known in the art, for example as discussed in the article by B. C. Kang, "Growth of β-SiC nanowires on Si (100) substrates by MOCVD using nickel as a catalyst" in *Thin Solid Films* 464-465 (2000) 215-219. As disclosed in that article, the nanowires can be grown on a nickel rich seed layer using dichloromethylvinylsilane ($CH_2ChSiC(CH_3)Cl_2$) as a precursor in a metal-organic chemical vapor deposition (MOCVD) process. The deposition can be carried out at a pressure of about 50 mTorr in a temperature range of about 800-1000° C. without a post sintering treatment. Preferably the nanowires are grown to a length of a few μm. The nanowires grow wherever there is an exposed nucleating layer, including on the gate electrode, if desired. If no nanowire growth is desired on the gate electrodes, the polycrystalline silicon can be masked with a layer of hard mask material (not illustrated) such as silicon nitride before the gate electrodes are patterned. The hard mask material remains in place and either masks the nickel rich area on the top of the gate electrode during the nanowire growth if the nickel rich area is formed by the implantation of nickel ions, or prevents the formation of nickel silicide on the gate electrode if the nickel rich area is formed by silicidation. The β phase of SiC is preferred because that phase is characterized by low electrical resistivity.

Figure 7:
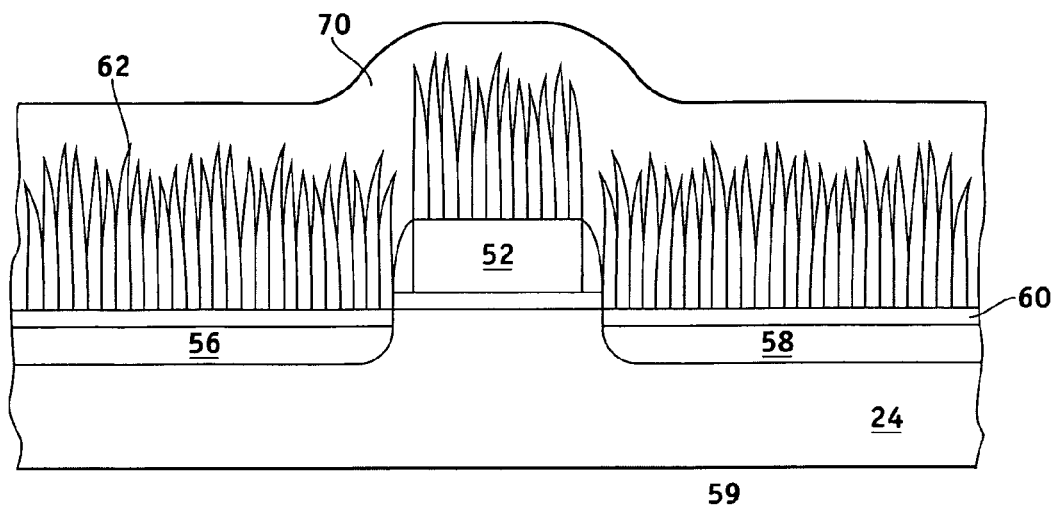

After the growth of the SiC nanowires, a layer 70 of dielectric material such as silicon oxide formed from tetraethylorthosilicate (TEOS) is deposited by plasma enhanced chemical vapor deposition (PECVD) to at least partially surround the nanowire structure as illustrated in FIG. 7. Layer 70 is deposited to a thickness of about 200 nm and serves to both stabilize the nanowire structure and to act as an interlayer dielectric.

Figure 8:
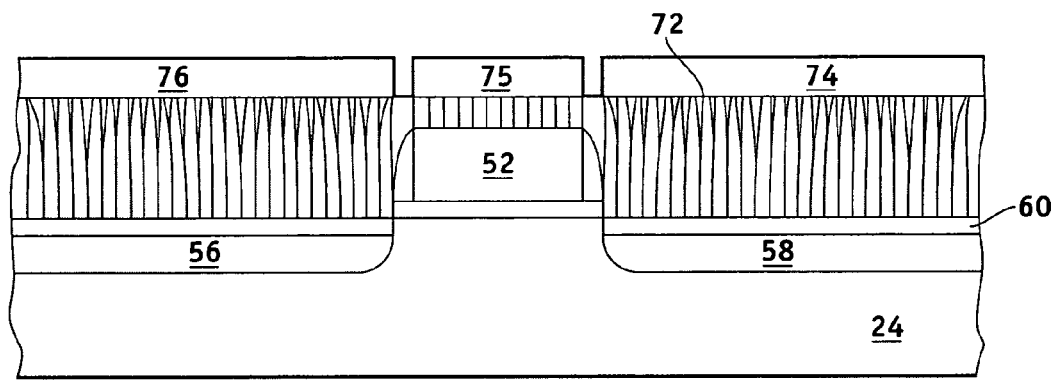

The layer of TEOS oxide is planarized by a CMP process to planarize the top surface of the ILD layer, to remove the top of the nanowire structure that extends above the planarized ILD layer, and to expose a portion 72 of the nanowire structure. In accordance with a preferred embodiment of the invention portion 72 of the nanowire structure is plasma etched, for example in a $CF_4$ chemistry, to clean the structure and to electrically activate the top of the structure by removing any passivation that may remain on the planarized ends of the nanowires. A layer of interconnect metal is deposited onto the planarized ILD layer and in contact with portion 72 of the nanowire structure. The interconnect metal is patterned to form portions 74, 75, 76 of one layer of interconnect metallization as illustrated in FIG. 8. The interconnect metallization can be, for example, aluminum or an aluminum alloy that is deposited and patterned by a photolithographic patterning and etching process (as illustrated), or can be copper or a copper alloy that is patterned by a damascene process (not illustrated).

EXAMPLE 2

Figure 9:
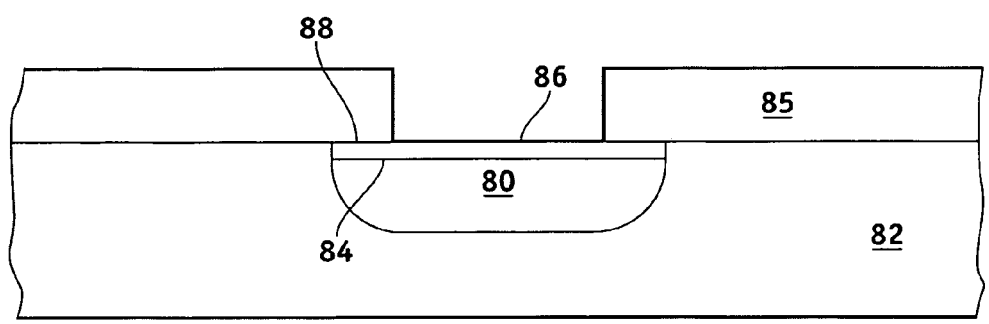
FIGS. 9-11 illustrate, in cross section, a portion of a semiconductor device and methods for its fabrication in accordance with yet further embodiments of the invention.

In accordance with a further embodiment of the invention, semiconductor device 79 includes an impurity doped region such as a P-type region 80 is formed in an N-type silicon substrate 82. A nickel rich region 84 is formed at the surface of region 80 either by the implantation of nickel ions or by silicidation to form nickel silicide as described above. A layer of photoresist 85 is applied to the surface of the substrate and is patterned to expose a portion 86 of the nickel rich region and to leave a masked and unexposed portion 88 of the nickel rich region as illustrated in FIG. 9.

Figure 10:
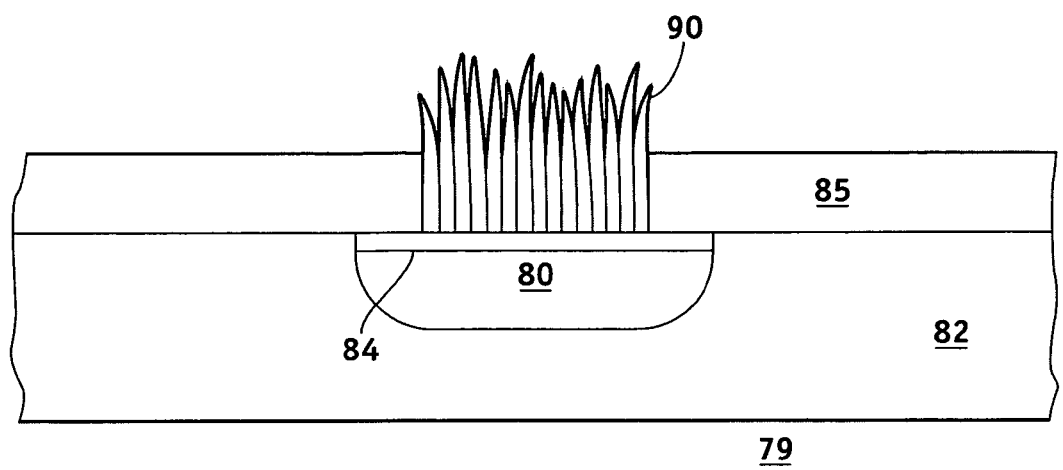

SiC nanowires 90 are selectively grown on the exposed portion 86 of nickel rich region 84 using a selective growth process similar to the process described above to fabricate the intermediate device structure as illustrated in FIG. 10. Preferably the selective growth process of this embodiment is carried out at a lower temperature, for example by utilizing a plasma enhanced deposition process. The SiC nanowires, which form a nanowire structure, are grown to a length of several micrometers.

Figure 11:
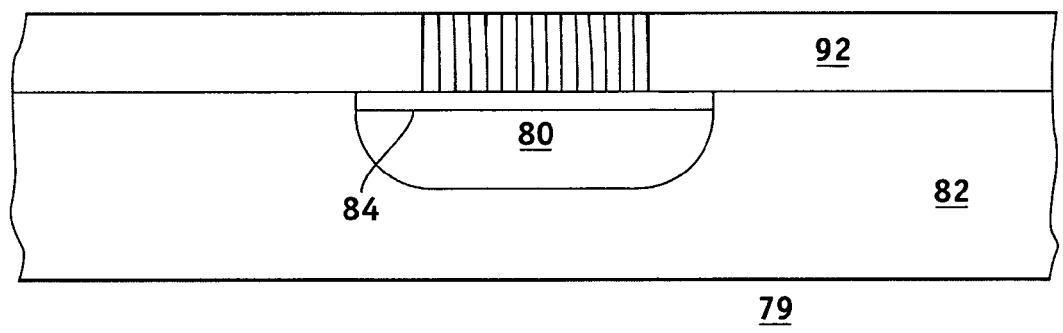

The photoresist mask is removed and a layer of dielectric material 92 is deposited to at least partially surround the nanowire structure. In the same manner as described above, the layer of dielectric material is planarized, for example by CMP, to expose and to planarize the top of the nanowire structure as illustrated in FIG. 11. Although not illustrated, the process in accordance with this embodiment of the invention continues, as above, to activate the top of the nanowire structure and to form an interconnect metallization layer contacting the nanowire structure.

EXAMPLE 3

The foregoing discussion has focused on the use of a nanowire structure to form a contact between a doped region in a semiconductor substrate or a polycrystalline silicon gate electrode and an overlying layer of interconnect metallization. In accordance with a further embodiment of the invention, a nanowire structure is used to form a contact between layers of interconnect metallization. As previously noted, an integrated circuit may require many devices and several layers of interconnect metallization to wire the many devices in the intended circuit configuration. Contact must be made between interconnect metallization layers at selected locations, and those contacts must be small, low resistance, and reliable. FIGS. 12-15 illustrate, in cross section, a portion of a semiconductor device and method steps for implementing such a device in accordance with this embodiment of the invention.

Figure 12:
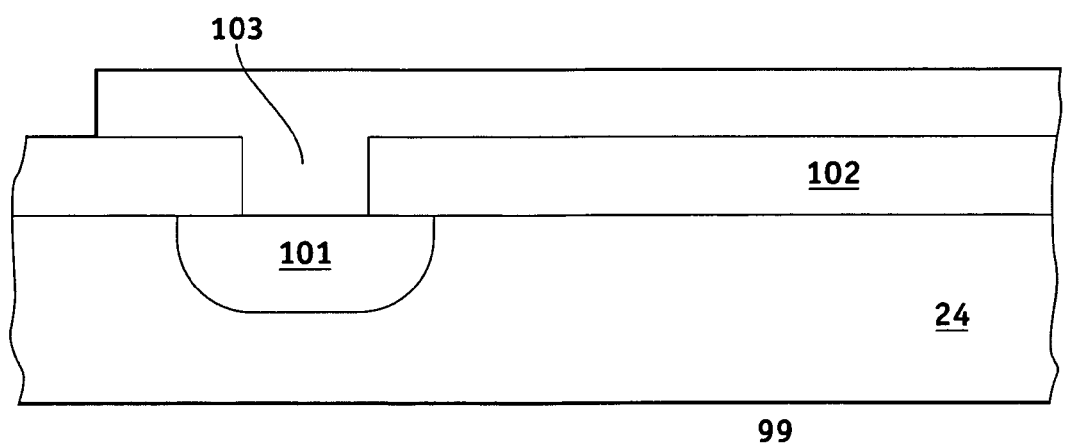
FIGS. 12-15 illustrate, in cross section, a portion of a semiconductor device and method steps for implementing such a device in accordance with another embodiment of the invention.

As illustrated in FIG. 12, a semiconductor device 99 includes a layer of patterned interconnect metallization 100 positioned overlying a layer 102 of interlayer dielectric material. The term "interconnect metallization" is herein used to include polycrystalline silicon which may be used for a layer of interconnect. Interconnect metallization 100 may electrically contact other lower layers of interconnect metallization or other device regions in or on the semiconductor substrate. As illustrated in this exemplary embodiment, interconnect metallization 100 contacts an impurity doped region 101 formed in semiconductor substrate 24. The contact 103 between the impurity doped region and the interconnect metallization may be formed by a nanowire structure, a metallic plug, or the like.

Figure 13:
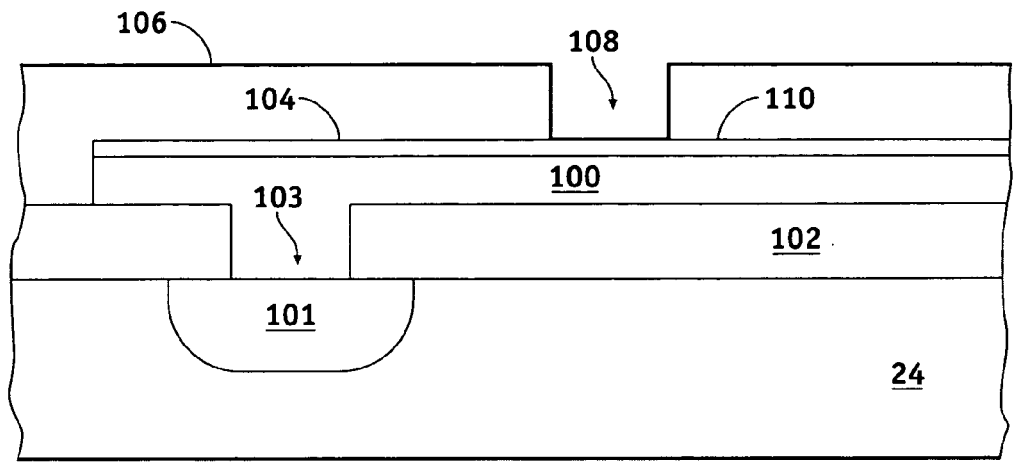

A nickel rich region 104 is formed at the surface of interconnect metallization 100. The nickel rich region is formed either by the implantation of nickel ions into the surface of the interconnect metallization or by the deposition of a layer comprising nickel metallization onto the surface of the interconnect metallization, or in the case of polycrystalline silicon interconnect, by the formation of a nickel silicide layer. In the case of aluminum interconnect metallization, nickel can be deposited onto the surface of the aluminum, for example by physical vapor deposition, prior to the patterning of the aluminum to form interconnect metallization 100. The nickel layer and the layer of aluminum can be patterned together. After forming the nickel rich region, a layer of photoresist 106 is applied over the metal and is patterned as illustrated in FIG. 13. The patterned photoresist exposes a portion 108 of the nickel rich region and masks a portion 110 of the nickel rich region.

Figure 14:
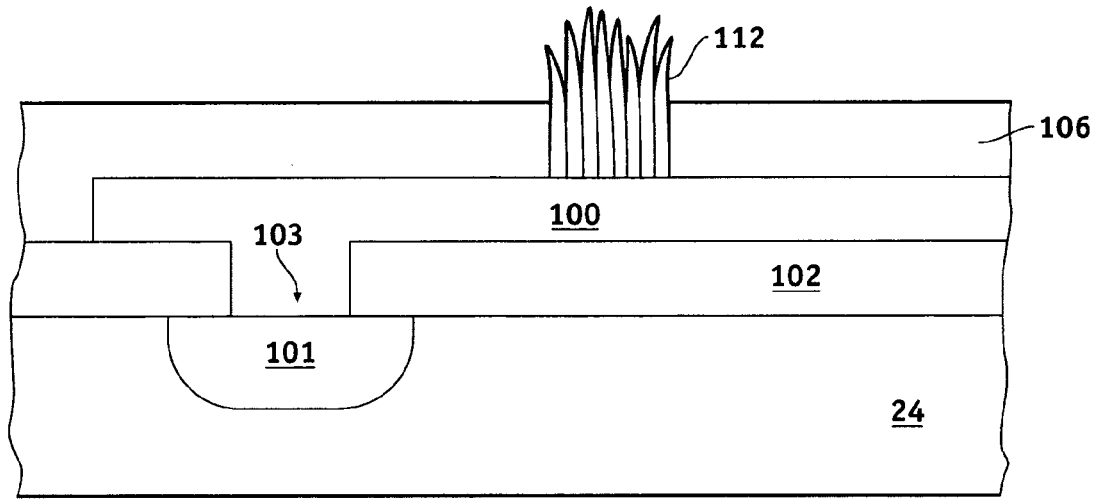

SiC nanowires are selectively grown on the exposed portion 108 of nickel rich region 104 using the same selective growth process described above to form a nanowire structure 112. The SiC nanowires can be grown to a length of several micrometers as illustrated in FIG. 14. The patterned photoresist prevents the growth of the nanowires except on the exposed portion of the nickel rich region.

Figure 15:
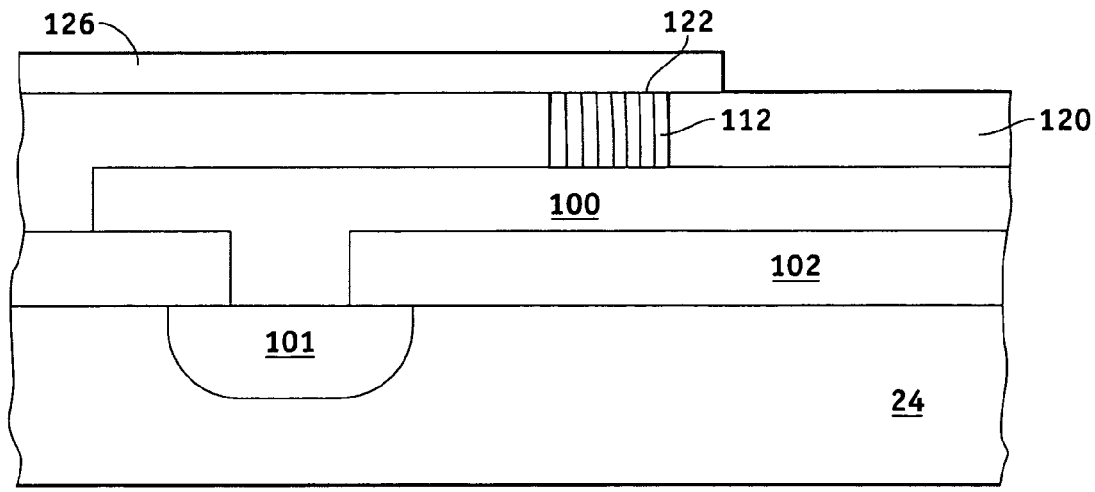

Patterned photoresist 106 is removed and a layer 120 of dielectric material, such as PECVD silicon oxide is deposited to at least partially cover and surround the SiC nanowire structure. The surface of layer of dielectric material is planarized, for example by CMP, as illustrated in FIG. 15. The planarization process also exposes and planarizes the top 122 of nanowire structure 112. The processing of the semiconductor device of this example 3 can be continued by forming a patterned layer of interconnect metallization 126 on the planarized surface of layer 120 of dielectric material and contacting top 122 of the nanowire structure. Nanowire structure 112 thus form a contact between interconnect metallization 100 and layer of interconnect metallization 126 formed on the surface of layer 120 of dielectric material.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof. For example, other nucleation materials besides nickel rich materials and other selectively deposited nanowires of materials other than SiC may be used to form the contact structures.

What is claimed is:

1. A method for fabricating a semiconductor device including a semiconductor substrate, the method comprising the steps of:
    forming an impurity doped region in the semiconductor substrate, the impurity doped region having a surface;
    forming a first layer comprising nickel contacting the surface;
    masking a first portion of the first layer and leaving a second portion of the first layer unmasked; and
    growing a nanowire structure comprising silicon and carbon on the second portion of the first layer.

2. The method of claim 1 wherein the step of masking comprises the step of masking with a layer of patterned photoresist material.

3. The method of claim 1 further comprising the steps of:
    depositing a layer of dielectric material overlying the semiconductor substrate and at least partially surrounding the nanowire structure; and
    planarizing the layer of dielectric material by a chemical mechanical planarization (CMP) process to expose a portion of the nanowire structure.

4. The method of claim 3 further comprising the step of patterning a layer of interconnect metal overlying the layer of dielectric material and contacting the portion of the nanowire structure.

5. The method of claim 1 wherein the step of forming a first layer comprises implanting nickel ions into the surface of the impurity doped region.

6. The method of claim 1 wherein the semiconductor substrate comprises silicon and wherein the step of forming a first layer comprises the steps of:
    depositing a layer comprising nickel overlying the surface of the impurity doped region; and
    heating the layer of nickel to react the nickel with the semiconductor substrate to form nickel silicide.

7. A method for fabricating a semiconductor device including a semiconductor substrate comprising silicon, the method comprising the steps of:
    implanting impurity determining dopant ions into the semiconductor substrate to form an impurity doped region;
    depositing a first layer comprising nickel onto the impurity doped region;
    heating the first layer to react the first layer with the impurity doped region to form a second layer comprising nickel silicide;
    applying a layer of photoresist overlying the second layer;
    patterning the layer of photoresist to expose a portion of the second layer;
    growing a silicon carbon nanowire structure on the portion of the second layer;
    removing the layer of photoresist;
    depositing a third layer comprising dielectric material onto the silicon carbon nanowire structure and the second layer;
    removing a portion of the third layer to expose a portion of the silicon carbon nanowire structure; and
    electrically contacting the portion of the silicon carbon nanowire structure with a layer of patterned interconnect metal.

8. The method of claim 7 further comprising the step of subjecting the portion of the nanowire structure to a plasma etch prior to the step of electrically contacting.

9. The method of claim 7 wherein the step of removing a portion of the third layer comprises the step of removing a portion of the third layer by a process of chemical mechanical planarization.

10. A method for fabricating a semiconductor device including a semiconductor substrate, the method comprising the steps of:
    forming an impurity doped region in the semiconductor substrate;
    forming a first metallic interconnect layer electrically coupled to the impurity doped region;
    forming a nucleating layer overlying the first metallic interconnect layer;
    forming a masking layer overlying the nucleating layer, wherein the masking layer exposes a portion of the nucleating layer;
    selectively growing an electrically conductive nanowire structure on the exposed portion of the nucleating layer;
    removing the masking layer;
    depositing a layer of dielectric material at least partially surrounding the conductive nanowire structure; and
    planarizing the layer of dielectric material to expose a portion of the conductive nanowire structure.

11. The method of claim 10 further comprising the step of patterning a second layer of interconnect metallization contacting the portion of the conductive nanowire structure.

12. The method of claim 10 wherein the step of forming a nucleating layer comprises the step of forming a layer comprising nickel on the first metallic interconnect layer.

13. The method of claim 10 wherein the step of selectively growing an electrically conductive silicon carbon nanowire structure comprises the step of growing the silicon carbon nanowire structure by a process of MOCVD.

14. A method for fabricating a semiconductor device comprising the steps of:
    forming a first conductive layer;
    forming a nucleating layer on the first conductive layer;
    forming a masking layer overlying the nucleating layer, wherein the masking layer exposes a portion of the nucleating layer;
    selectively growing a nanowire structure on the exposed portion of the nucleating layer;
    removing the masking layer;
    depositing a dielectric layer at least partially surrounding the nanowire structure;
    planarizing the dielectric layer to expose a portion of the nanowire structure; and
    forming a patterned interconnect layer overlying the dielectric layer and contacting the portion of the nanowire structure.

* * * * *